United States Patent
Marxsen et al.

(10) Patent No.: US 6,774,030 B2
(45) Date of Patent: Aug. 10, 2004

(54) METHOD AND SYSTEM FOR IMPROVING THE MANUFACTURING OF METAL DAMASCENE STRUCTURES

(75) Inventors: Gerd Marxsen, Radebeul (DE); Axel Preusse, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/304,904

(22) Filed: Nov. 26, 2002

(65) Prior Publication Data

US 2003/0224596 A1 Dec. 4, 2003

(30) Foreign Application Priority Data

May 29, 2002 (DE) .......................... 102 23 945

(51) Int. Cl.[7] .......................... H01L 21/4763
(52) U.S. Cl. .......................... 438/637; 438/692
(58) Field of Search .......................... 438/221, 296, 438/424, 426, 435, 437, 637, 692

(56) References Cited

U.S. PATENT DOCUMENTS

| | | | |
|---|---|---|---|
| 5,461,007 A | 10/1995 | Kobayashi | 437/225 |
| 5,795,495 A * | 8/1998 | Meikle | 216/88 |
| 6,153,116 A | 11/2000 | Yang et al. | 216/85 |
| 6,172,756 B1 | 1/2001 | Chalmers et al. | 356/381 |
| 6,191,864 B1 | 2/2001 | Sandhu | 356/503 |
| 6,292,265 B1 | 9/2001 | Finarov et al. | 356/630 |
| 6,425,801 B1 | 7/2002 | Takeishi et al. | 451/5 |
| 6,645,825 B1 * | 11/2003 | Lan et al. | 438/424 |

FOREIGN PATENT DOCUMENTS

| | | | | |
|---|---|---|---|---|
| JP | 11345791 A | 12/1999 | | H01L/21/304 |
| WO | WO 02/10729 A1 | 2/2002 | | G01N/21/86 |

* cited by examiner

Primary Examiner—Phuc T. Dang
(74) Attorney, Agent, or Firm—Williams, Morgan & Amerson, P.C.

(57) ABSTRACT

In a method of in situ controlling the degree of fullness of wide lines in a damascene structure, an optical endpoint detection signal is analyzed so as to determine a time interval of substantially constant signal amplitude. The time interval is then used as a measure of the metal filled in a wide line in a damascene structure. By correlating the length of the time interval to at least one process parameter involved in the formation of the damascene structure, the degree of fullness of lines in the damascene structure may be controlled to maintain within a predefined allowable range.

18 Claims, 5 Drawing Sheets

METHOD AND SYSTEM FOR IMPROVING THE MANUFACTURING OF METAL DAMASCENE STRUCTURES

BACKGROUND OF THE INVENTION

1. Field of the Invention

Generally, the present invention relates to the field of manufacturing integrated circuits, and, more particularly, to the formation of so-called damascene structures in which metal trenches and vias are formed in an insulating layer, wherein the trenches and vias are formed prior to depositing the metal. Subsequently, the structure is planarized by removing the excess metal by chemical mechanical polishing.

2. Description of the Related Art

Typically, the fabrication of modern integrated circuits requires a huge number of individual process steps, wherein a typical process sequence involves the deposition of conductive, semiconductive or insulating layers on an appropriate substrate. After deposition of the corresponding layer, device features are produced by patterning the corresponding layer using well-known means, such as photolithography and etching. As a consequence, by patterning a deposited layer, a certain topography will be created that also affects deposition and patterning of subsequent layers. Since sophisticated integrated circuits require the formation of a plurality of subsequent layers, it has become standard practice to periodically planarize the surface of the substrate so as to provide for well-defined conditions for deposition and patterning of subsequent material layers. This holds true especially for so-called metallization layers in which metal interconnects are formed to electrically connect the individual device features, such as transistors, capacitors, resistors, and the like, to establish the functionality required by the circuit design.

Recently, the so-called damascene technique has become a preferred method in forming metallization layers wherein a dielectric layer is deposited and patterned to include trenches and vias that are subsequently filled with an appropriate metal, such as aluminum or copper. The excess metal is then removed, and the resulting surface is planarized by performing a chemical mechanical polishing (CMP) process. Chemical mechanical polishing has proven to be a reliable technique to remove the excess metal and planarize the resulting surface so as to leave behind metal trenches and vias that are electrically insulated from each other as required by the corresponding circuit layout. Chemical mechanical polishing typically requires the substrate to be attached to a carrier, a so-called polishing head, such that the substrate surface to be planarized is exposed and may be placed against a polishing pad. The polishing head and polishing pad are moved relative to each other by individually moving the polishing head and the polishing pad. Typically, the head and pad are rotated against each other while the relative motion is controlled to achieve as uniform a material removal as possible. During the polishing operation, a slurry that includes at least one chemically reactive agent and possibly abrasive particles is supplied to the surface of the polishing pad.

One problem involved in the chemical mechanical polishing of substrates is the very different removal rates of differing materials, such as of a metal and a dielectric material from which the excess metal has to be removed. For instance, at a polishing state where the dielectric material and the metal are simultaneously treated, i.e., after the major portion of the metal has already been removed, the removal rate for the metal exceeds the removal rate for the dielectric material. This is desirable because all metal is reliably ablated from all insulating surfaces, thereby insuring the required electrical insulation. Thus, a metal trench or via may be recessed with respect to the surrounding insulating material resulting in a trench or via that exhibits an increased electrical resistance due to the reduced cross-sectional area. In order to more clearly demonstrate a typical damascene process, reference is made to FIGS. 1a–1e.

FIGS. 1a–1e schematically show cross-sectional views of a semiconductor structure 100 at various stages in fabricating a metallization layer according to a typical damascene process sequence.

Figures 1A, 1B:
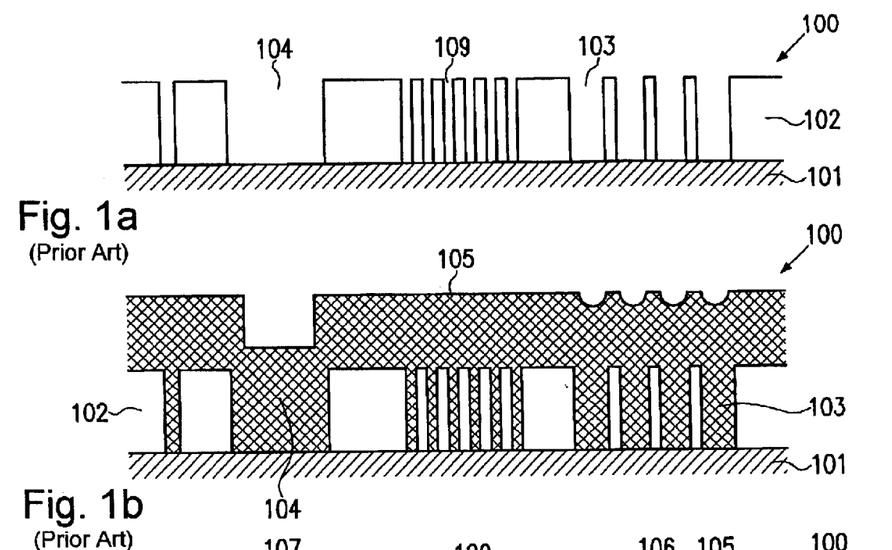
FIGS. 1a–1e schematically show cross-sectional views of a typical damascene structure during various manufacturing stages.

In FIG. 1a, the semiconductor structure 100 comprises a substrate 101 bearing circuit features (not shown) and an insulating cap layer on which metal lines are to be formed. A patterned dielectric layer 102 is formed over the substrate 101 and includes openings, for example, in the form of narrow trenches 103 and wide trenches 104. The dielectric layer 102 may also comprise closely-spaced openings 109. The openings for the trenches 103, 109 and 104 are patterned in conformity with design rules to establish metal lines exhibiting the required electrical characteristics in terms of functionality and conductivity. For instance, the trench 104 is designed as a so-called wide line to provide for a low electrical resistance. The deposition of the dielectric material 102, as well as the patterning of the trenches 103, 109 and 104, is carried out by well-known deposition and photolithography techniques.

FIG. 1b schematically depicts the semiconductor structure 100 after deposition of a metal layer 105, for example, a copper layer when sophisticated integrated circuits are considered. As is evident from FIG. 1b, the topography of the metal layer 105 will be affected by the underlying pattern of the dielectric layer 102. The metal layer 105 may be deposited by chemical vapor deposition, sputter deposition or, as usually preferred with copper, by electroplating with a preceding sputter deposition of a corresponding copper seed layer. Although the precise shape of the surface profile of the metal layer 105 may depend on the deposition technique used, in principle, a surface shape will be obtained as shown in FIG. 1b.

Subsequently, the semiconductor structure 100 will be subjected to chemical mechanical polishing, in which, as previously mentioned, the slurry and polishing pad are selected to optimally remove the excess metal in the metal layer 105. During the chemical mechanical polishing, the excess metal is removed and, finally, surface portions 120 of the dielectric material 102 will be exposed, wherein it is necessary to continue the polishing operation for a certain overpolish time to ensure clearance of the metal from all insulating surfaces in order to avoid any electrical short between adjacent metal lines. As previously mentioned, the removal rate of the dielectric material and the metal may significantly differ from each other so that upon overpolishing the semiconductor structure 100, the copper in the trenches 103, 109 and 104 will be recessed.

Figure 1C:
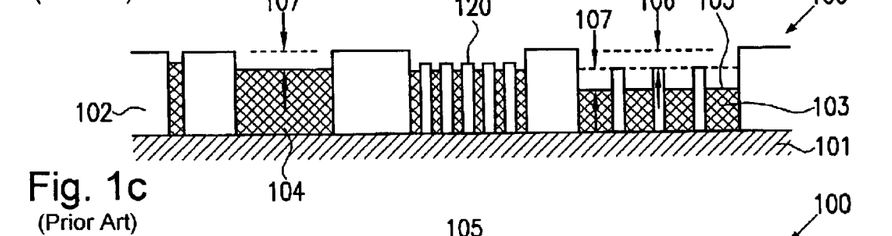

FIG. 1c schematically shows a typical result of chemical mechanical polishing of the structure shown in FIG. 1b. As is evident from FIG. 1c, during overpolishing the semiconductor structure 100, different materials are simultaneously polished with different removal rates. The removal rate is also dependent, to some degree, on the underlying pattern. For instance, the recessing of the metals during the overpolish time, which is also referred to as dishing, as well as the removal of the dielectric material, also referred to as erosion, is significantly affected by the type of pattern to be polished. In FIG. 1c, dishing and erosion at the wide trenches 104, as indicated by 107 and 106, respectively, are relatively moderate, whereas at the narrow lines 103, dishing 107 and erosion 106 are significantly increased. In obtaining a required electrical conductivity, circuit designers have to take into consideration a certain degree of dishing and erosion. The situation described in FIG. 1c may, however, significantly change when the deposition of the metal layer 105 is completed with an insufficient layer thickness.

Figure 1D:
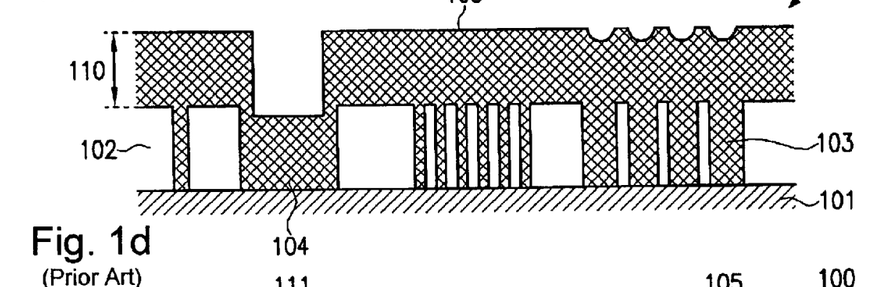

In FIG. 1d, the metal layer 105 has been deposited with a thickness 110, which may not be appropriate to completely fill the wide line 104. The incomplete filling of the wide line 104 may be caused by any variations in the deposition process used.

Figure 1E:
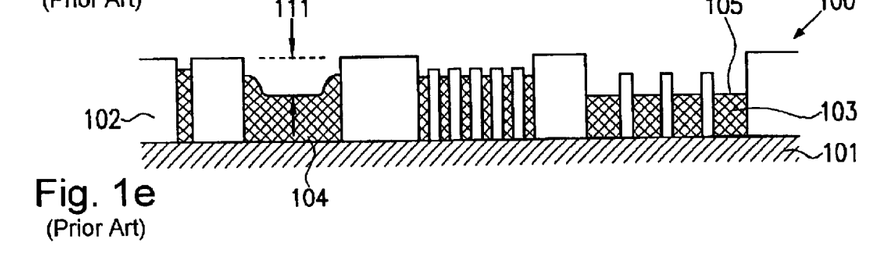

In FIG. 1e, the semiconductor structure 100 is shown after being subjected to the chemical mechanical polishing, wherein, due to the incomplete filling of the wide line 104, a metal line is produced that lacks a significant amount of metal, as indicated by the arrow 111. The amount of dishing 111 may, in addition to the foregoing incomplete filling, be affected by the process conditions during the chemical mechanical polishing, for example, the ratio of removal rate of metal and dielectric may have changed. Thus, a variation of the deposition process and/or a variation during the chemical mechanical polishing may lead to a variation of the degree of dishing that might be outside the acceptable tolerances. Although the metal layer 105 may be deposited with a layer thickness providing a safety margin for completely filling the wide line 104, a corresponding layer thickness may, however, require a longer deposition time as well as an increased process time during polishing of the substrate, thereby resulting in a reduced throughput. Conventionally, control of the fill degree of metal lines requires the examination of cross-sections of the substrate or, for wide metal lines, the absolute thickness of the metal within these wide lines may be determined by well-established metal thickness metrology. In any case, a great deal of effort is necessary to determine the degree of metal filling within metal lines and to establish a corresponding process window for the deposition parameters and for the polishing parameters to achieve appropriately filled metal lines.

In view of the above problems, it would be highly desirable to eliminate, or at least reduce, one or more problems involved in manufacturing metal lines in a damascene structure.

SUMMARY OF THE INVENTION

Generally, the present invention is directed to a method for estimating in situ whether or not the amount of metal in a line is within specified manufacturing tolerances. To this end, an optical signal is supplied to the surface to be planarized during the chemical mechanical polishing, and the signal amplitude of the reflected light is used to verify process parameters relating to the deposition of the metal layer and/or the chemical mechanical polishing. Some CMP tools available on the market exhibit a so-called in situ endpoint detection in which a system is provided that allows one to supply a light beam on the substrate through an opening in the polishing pad surface and to detect a light beam reflected from the surface to determine the clearance of the substrate surface upon a significant change of the signal amplitude of the reflected beam. By employing such a CMP tool having an optical endpoint detection, the method of the present invention may readily be implemented in a conventional process line without adding to process complexity and costs whereby further measurements, for example, investigations of cross-sections, may be avoided or at least reduced, thereby increasing production yield.

According to one illustrative embodiment of the present invention, a method of estimating an amount of metal in a damascene structure during chemical mechanical polishing of the structure comprises directing a light beam onto a surface of the damascene structure that is being planarized. A portion of the light beam scattered by the damascene structure is then detected and a first time point is determined that is indicative of a rising edge and a second time point is determined that is indicative of a falling edge of an intensity of the portion of the scattered light beam. From a time interval defined by the first and second time points, it is then estimated that the amount of metal of the damascene structure is sufficient when a length of the time interval exceeds a predefined threshold.

According to a further illustrative embodiment of the present invention, a method of controlling an amount of metal in a recessed region of a damascene structure formed on plural substrates comprises depositing the metal over a dielectric layer, including the recessed region that is formed on a first substrate. Then, a portion of the metal is removed by chemical mechanical polishing and an optical endpoint signal obtained during the chemical mechanical polishing is detected. The method further comprises obtaining a time interval between a rising edge and a falling edge of the optical endpoint signal and controlling at least one process parameter relating to at least one of depositing the metal and the chemical mechanical polishing on the basis of-the time interval while processing a second substrate.

In a further embodiment of the present invention, a system for controlling an amount of metal in a recessed region of a damascene structure formed on a substrate comprises a CMP tool including an optical endpoint detection system. The system further comprises a control unit that is configured to determine a length of a time interval representing a substantially constant signal amplitude of an output signal supplied by the endpoint detection system.

According to yet another illustrative embodiment of the present invention, a system for estimating the amount of metal in a damascene structure comprises an optical system adapted to direct a light beam onto the surface of a substrate during chemically mechanically polishing the surface, wherein the optical system includes a detector configured to receive a light beam scattered by the surface of the substrate and to output a signal indicative of an intensity of the scattered light beam. Moreover, a control unit is provided that is configured to determine a time interval representing a period of increased substantially constant amplitude of the signal. The control unit is further configured to provide an indication signal indicating the length of the time interval.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Furthermore, it should be added that the following illustrative embodiments refer to copper lines formed in silicon dioxide, wherein the copper is deposited by electroplating preceded by sputter deposition of a copper seed layer. It should be understood, however, that any appropriate metal, such as aluminum, tungsten, and the like, as well as any appropriate dielectric material, such as silicon nitride, silicon oxynitride, any low-K material, and the like, may be used in the damascene structure. Regarding the deposition of the metal, any appropriate deposition method, such as chemical vapor deposition with or without plasma enhancement and any physical vapor deposition, may be used in addition or alternatively to electroplating to deposit the metal over the dielectric material.

Figure 2:
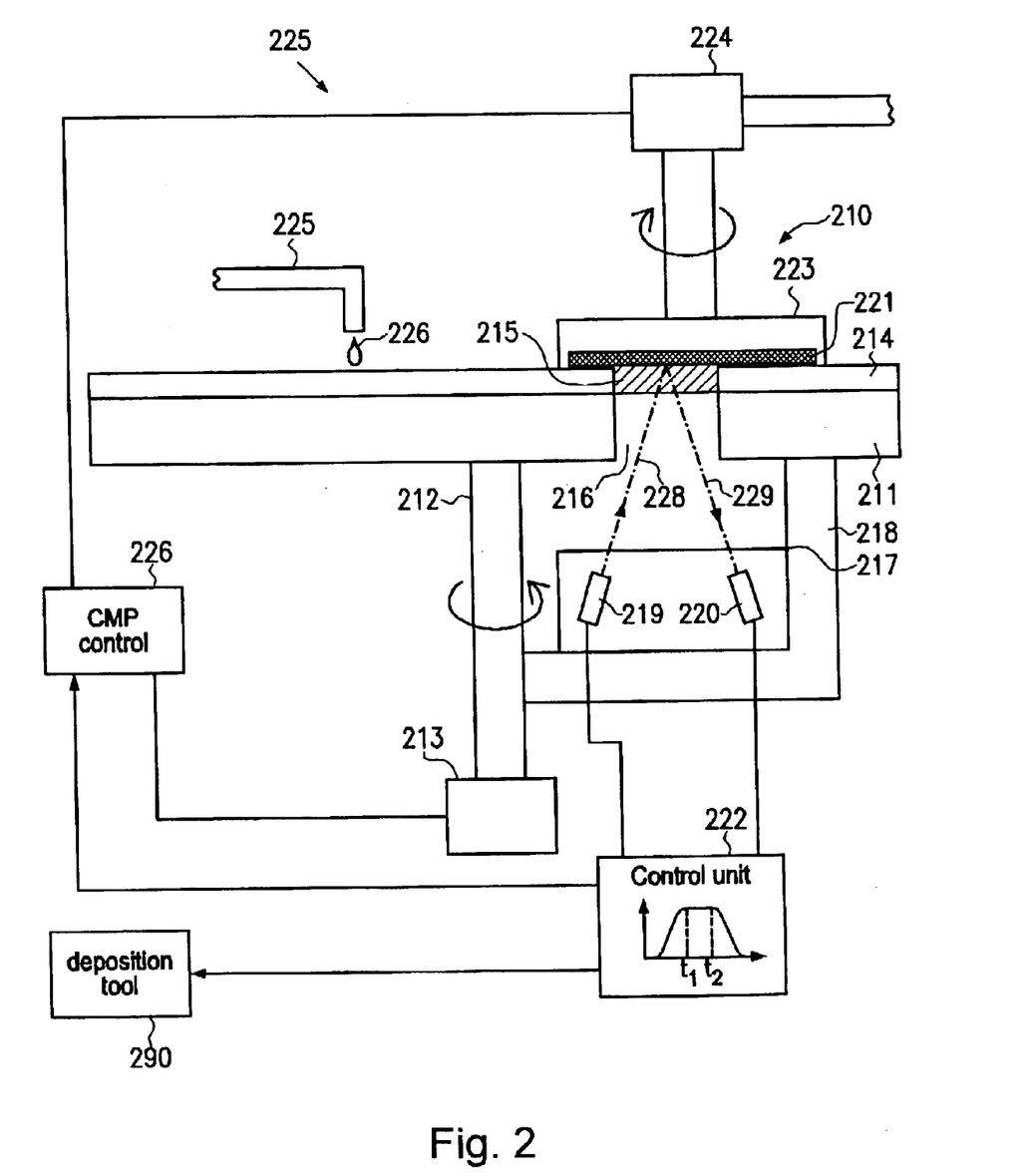
FIG. 2 is a simplified cross-sectional view of a CMP tool having an optical system for endpoint detection.

With reference to the figures, illustrative embodiments of the present invention will now be described. In FIG. 2, a system 200 for producing metal lines of a damascene structure, for example, a structure as shown in FIGS. 1a–1e, comprises a deposition tool 290 and a CMP tool 210. The deposition tool 290 may be an electroplating system appropriate for depositing copper over a patterned dielectric layer as shown in FIG. 1a. To this end, the deposition tool 290 may further comprise a sputter deposition tool (not shown) to apply a copper seed layer prior to depositing the bulk copper. However, in other embodiments the deposition tool 290 may be any chemical vapor deposition tool or physical vapor deposition tool.

The CMP tool 210 comprises a polishing platen 211 that is rotatably supported by a shaft 212, which, in turn, is driven by a driving means 213, such as a brushless DC motor. On top of the polishing platen 211, a polishing pad 214 is provided, which includes an optically translucent portion 215 covering an opening 216 formed in the polishing platen 211. An optical system 217 is arranged below the opening 216 and is attached to a support member 218, which, in turn, is mechanically coupled to the shaft 212 so as to be rotatable along with the polishing platen 211. The optical system 217 comprises a light source 219 configured to emit a light beam and direct it to the surface of a substrate 221 that is to be polished. Moreover, the optical system 217 includes a detector 220 that is adapted and arranged to receive a light beam reflected by the surface of the substrate 221. The optical system 217 is operatively connected to a control unit 222 that is internally configured to receive a signal from the detector 220 and to process the received signal in a way that will be described in detail below.

The substrate 221 is supported by a polishing head 223, which is rotatably mounted on a drive system 224. The details of the polishing head 223, including a plurality of tiny fluid lines for supplying different pressure to different areas of the substrate 221 and the like, are not shown in FIG. 2. Furthermore, a slurry applicator 225 is provided to supply a slurry 226 to the surface of the polishing pad 214. A CMP control unit 226 may be provided and may be operatively connected to the drive system 224 and the driving means 213.

In manufacturing a metallization layer according to a typical damascene process sequence, a copper layer is first deposited on a patterned dielectric layer, such as the layer 102 in FIG. 1a, by means of the deposition tool 290. Thereby, at least one process parameter, such as a deposition time, may be controlled to obtain a required layer thickness above the patterned dielectric layer 102, in particular above the wide line 104. Subsequently, the substrate 221 is attached to the polishing head 223 and the CMP control unit 226 releases the CMP tool 210 with a set of process parameters, such as speed of the polishing pad 211, speed of the polishing head 223, pressure applied to the substrate 221 by the polishing head 223, and the like, wherein the process parameters are targeted to obtain copper lines exhibiting the required electrical characteristics, while the damascene structure to be formed also exhibits a desired degree of flatness for the subsequent manufacturing of further metallization layers. While rotating the polishing pad 211, the optical system 217 is also rotated and the light source 219 is actuated by the control unit 222 to emit a light beam 228 through the translucent cover 215, which impinges onto the surface of the substrate 221 whenever the polishing head 223 is positioned above the opening 216. Preferably, the CMP control unit 226 controls the movement of the polishing head 223 which is also moveable radially with respect to the polishing platen 211 in such a way that the light beam 228 hits the substrate 221 substantially continuously during the CMP process. The light beam 228 is scattered by the substrate 221 and a reflected or scattered beam 229 is produced that is detected by the detector 220. It should be noted that the dimensions of the opening 216 are not true to scale and, in reality, the opening 216 only covers a small fraction of the surface of the polishing pad 214 so that the influence of the translucent cover 215 on the polishing efficiency is negligible. As previously explained, the degree of scattering and, thus, the intensity of the reflected light beam 229, depends on the surface topology of the substrate 221 and of the material covering the surface. For instance, copper exhibits a higher reflectivity than the dielectric material and, in a conventional CMP tool, including the optical system 217 acting as an endpoint detection system, advantage is taken of this difference in reflectivity. Thus, conventionally, a drop of the signal intensity of the reflected light beam 229 indicates the beginning of the clearance of the insulating material, and the polishing process is continued for a specified overpolish time to ensure complete removal of the copper from the surface portions of the dielectric material.

In the embodiments of the present invention, the time point of a rising edge and a falling edge of the signal indicating the intensity of the reflected light beam 229 is determined, and a time interval of the high intensity period of the signal is used as a measure for the amount of copper within the metal lines and is, thus, used as a measure for the correctness or the validity of the process parameters used in the deposition tool 290 and/or the CMP tool 210.

Figure 3A:
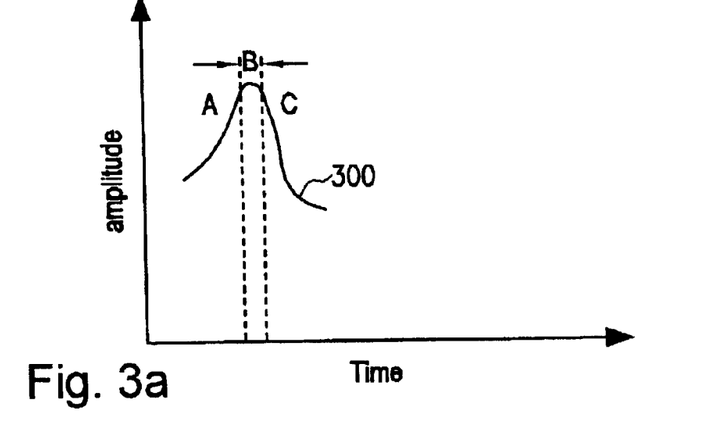
FIGS. 3a–3c schematically show different endpoint signals that are used to estimate the metal content in a wide line of a damascene structure according to one illustrative embodiment of the present invention.
Figure 3B:
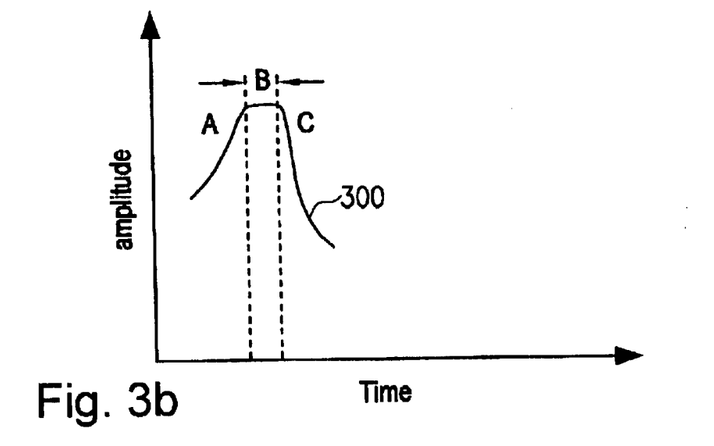
Figure 3C:
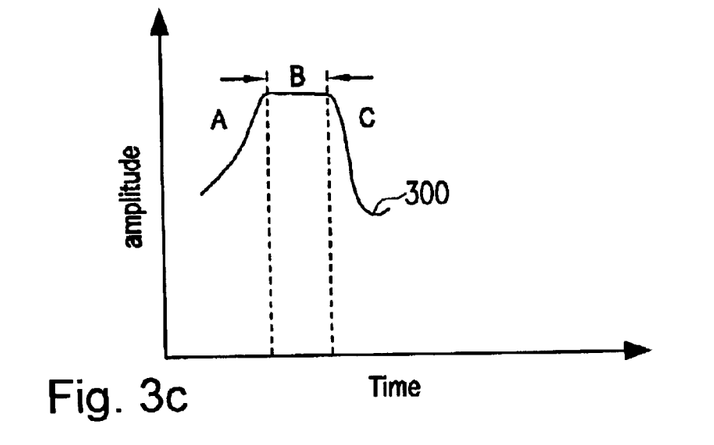
Figure 4A:
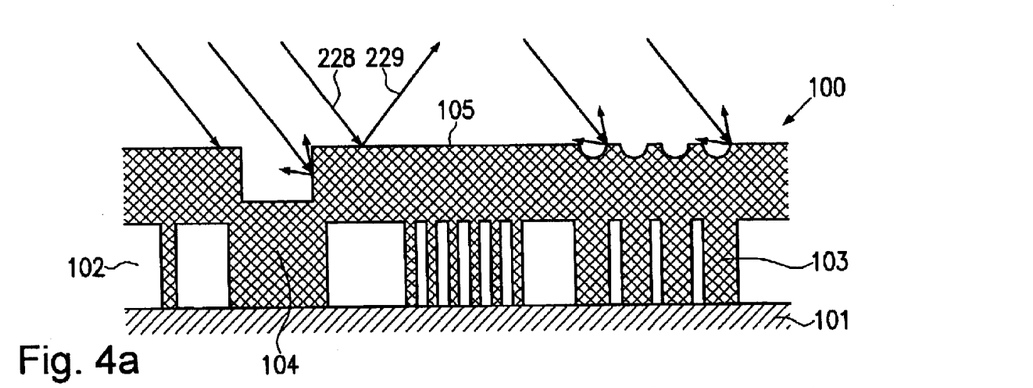
FIGS. 4a–4g schematically show cross-sectional views of a damascene structure at various manufacturing stages to explain the forms of the endpoint signals shown in FIGS. 3a–3c.

With reference to FIGS. 3a–3c and 4a–4g, the relationship between the signal provided by the detector 220 and the amount of copper within the metal lines of the damascene structure will now be described in more detail. FIG. 4a schematically shows a cross-section of a view of a damascene structure, wherein, for the sake of convenience, the same reference numbers are adhered to as in FIGS. 1a–1e and any explanation of the features is omitted.

In FIG. 4a, the light beam 228, emitted by the light source 219, impinges on the copper layer 105 and is reflected therefrom as the reflected beam 229, wherein the surface topology, caused by the narrow lines 103 and the wide line 104, leads to scattering of the incident light beam 228 and, thus, reduces the intensity of the reflected light beam 229.

Figure 4B:
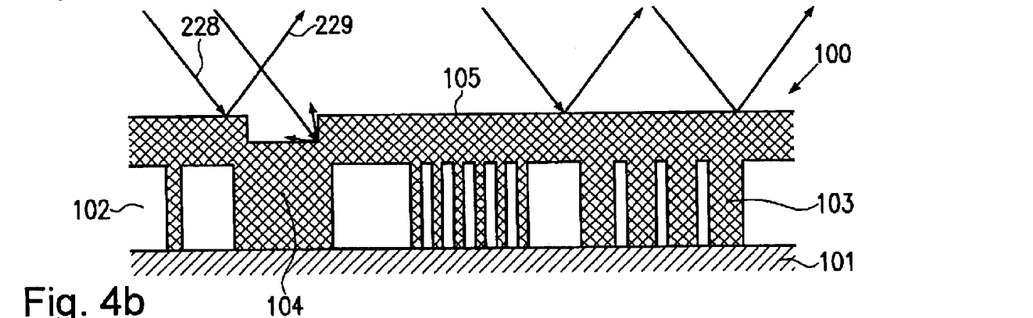

FIG. 4b shows the semiconductor structure 100 in an advanced stage of the CMP process, wherein a portion of the copper layer 105 is already removed, thereby steadily increasing the degree of flatness of the surface of the layer 105. Consequently, the intensity of the reflected light beam 229 increases as the polishing process continues.

Figure 4C:
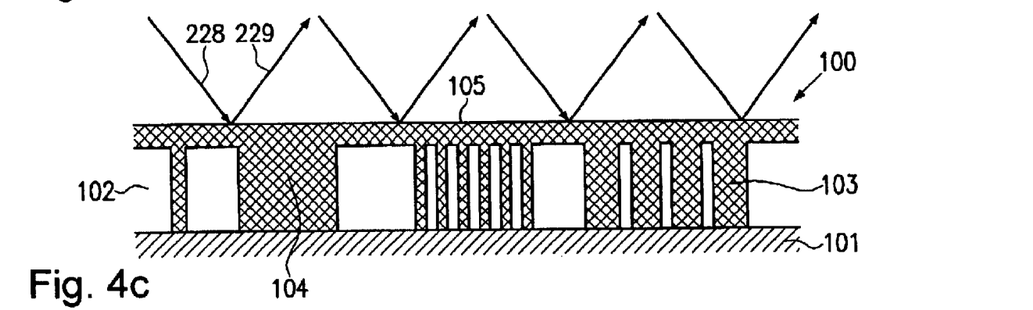

FIG. 4c depicts the semiconductor structure 100 in a stage when substantially the entire surface is planarized and, thus, any scattering events are minimized so that the intensity of the reflected light beam 229 is maximal.

Figure 4D:
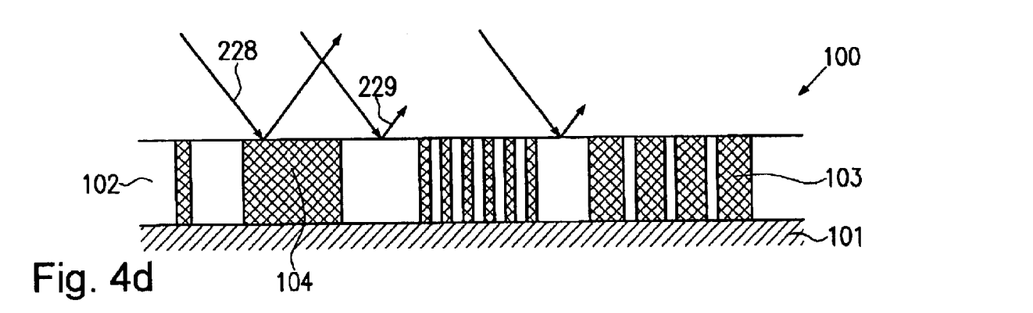

FIG. 4d shows the semiconductor structure 100 after the CMP process has continued to expose further portions of the dielectric layer 102, so that the intensity of the reflected light beam 229 decreases because the reflectivity of the exposed dielectric portions is significantly less than the reflectivity of the copper portions.

FIG. 3b depicts a diagram representing an output signal provided from the detector 220 with respect to the duration of the CMP process. In FIG. 3b, a curve 300 represents the intensity of the reflected light beam 229, wherein the diagram is divided into three portions A, B and C. The portion A indicates a rising edge of the curve 300, indicating the increase of the intensity of the reflected light beam 229 due to the increasing degree of flatness of the surface topology as explained with reference to FIGS. 4a-4b. At the transition between portion A and portion B, the surface is substantially planarized so that the intensity of the reflected light beam 229 reaches its maximum and is substantially maintained at this level as long as a planarized copper surface is present during the CMP process (see FIG. 4c). When the CMP process starts to expose portions of the dielectric layer 102, the intensity of the reflected light beam 229 is decreased (see FIG. 4d) and generates a falling edge of the curve 300 in portion C.

Figure 4E:
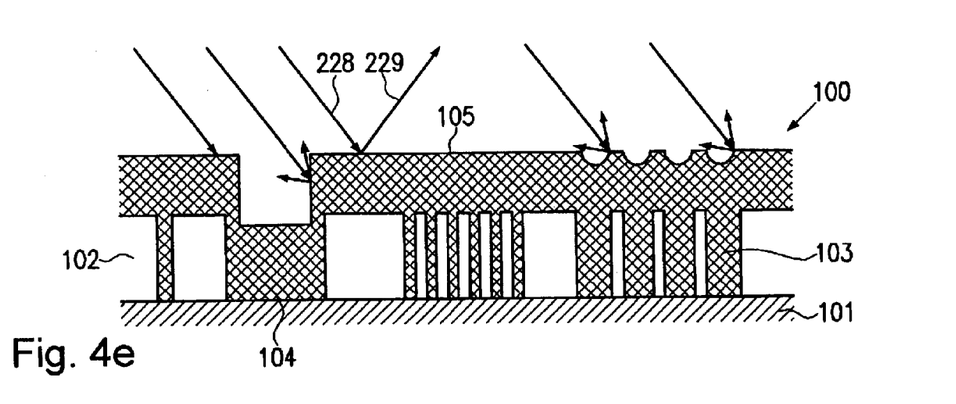

In FIG. 4e, the semiconductor substrate 100 is subjected to the CMP process, whereas, in contrast to FIG. 4a, the initial layer thickness of the copper layer 105 is decreased, for example, due to a parameter variation in the deposition process, so that the wide line 104 is not sufficiently filled with copper. Similar to FIG. 4a, the intensity of the reflected light beam 229 will, starting from an initial intensity, steadily increase as the CMP process continues due to the increasing degree of flatness.

Figure 4F:
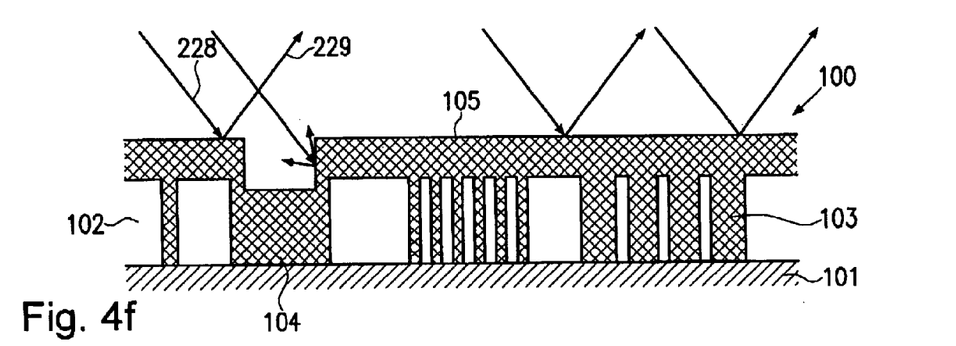
Figure 4G:
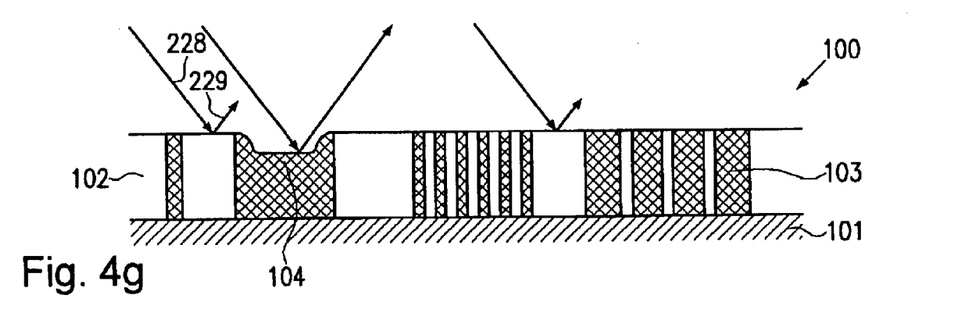

FIG. 4f shows an advanced stage of the CMP process, in which the surface of the copper layer 105 is essentially planarized except for the area over the wide line 104. With a decreasing depth of the opening formed over the wide line 104, the degree of scattering will also decrease and thus the intensity of the reflected light beam 229 will steadily increase. The process of increasing the intensity of the reflected light beam 229 still continues, even if the remaining surface portion of the copper layer 105 is substantially planar, since the degree of scattering over the wide line 104 is still steadily decreasing. Thus, the intensity of the reflected light beam 229 will become a maximum when the dielectric layer 102 is still covered by copper, even if only by a very thin layer, since the amount of scattering of the very shallow opening formed over the wide line 104 is then minimal.

According to FIG. 4f, when the CMP process starts to expose portions of the dielectric layer 102, the intensity of the reflected light beam 229 decreases, similarly to the case as described with reference to FIG. 4d, because the reflectivity of the dielectric is less than that of copper.

FIG. 3a shows the corresponding diagram depicting the signal amplitude of the reflected light beam 229 versus the polishing time. As is evident from FIG. 3a, the curve 300 is substantially comprised of a rising edge, represented by A, and a falling edge, represented by C, with none or only a small portion B located around the maximum reflectivity.

FIG. 3c shows a diagram representing the signal amplitude of the reflected light beam 229 versus the process time for a semiconductor structure 100 having a layer thickness that exceeds the thickness as shown in FIG. 4a. Consequently, the portion B, representing the time interval between the rising edge A and the falling edge C of the curve 300, is prolonged due to the longer time period in which a substantially flat copper surface is present during the CMP process.

Thus, the time interval between the rising edge and the falling edge of curve 300, represented by portion B, may be used as a measure of the copper content overlying the wide line 104 during the CMP process. That is, the time interval B may also be used as an indicator of the degree of fullness of the wide line 104 after completion of the CMP process. For example, the curve in FIG. 3a may indicate an insufficiently filled wide line 104, whereas the curves in FIGS. 3b and 3c indicate a sufficiently filled wide line 104. However, from an economic point of view, the curve in FIG. 3b may represent the target signal, since only the necessary amount of copper is deposited here, including a certain safety margin, thereby saving on deposition time and CMP polishing time. Hence, by establishing a correlation between a length of the time interval B and the amount of copper in the wide line 104, which may be accomplished by experiment and/or theory for one or more test substrates, the copper content may be monitored in situ.

In one illustrative embodiment, the control unit 222 of FIG. 2 is adapted to automatically determine the end of the rising edge of the curve 300 and the beginning of the falling edge of the curve 300 so that the time interval B may be determined. The control unit 222 may then output a corresponding signal indicative of the copper content in the wide line 104 to an operator and/or to a further control unit (not shown) and/or to the deposition tool 290 and/or to the CMP tool 210.

In a further embodiment, the control unit 222 may be further adapted to compare the time interval B with a predefined threshold value or to determine whether or not the time interval B is within a specified tolerance range. If the time interval B is judged to deviate from the target value or the target range, a control signal may be output to the deposition tool 290 to change at least one process parameter of the deposition process, for example, the deposition time, to compensate for the deviation of the time interval B from the respective target value or target range.

Since the output of the detector 220, i.e., the intensity of the reflected light beam 229, represents the combined effect on the surface topology of the CMP process and the preceding deposition procedure, it may be desirable to separately change parameter values of the deposition tool 290 and of the CMP tool 210. For example, as explained before with reference to FIGS. 4a–4f, the magnitude of the time interval B may depend on the layer thickness of the initial copper layer 105. However, a variation of the process parameters of the CMP process, for example, a decrease of the removal rate, may also lead to a variation of the time interval B. A decreasing removal rate leads to an increased time interval B, thereby possibly indicating an initial copper layer thickness that is too high. A corresponding reduction of the initial copper thickness, in a subsequent substrate, may then, however, result in an insufficiently filled wide line 104. Thus, in one embodiment, the slope of the rising edge A and/or of the falling edge C may be determined, which may represent a measure of the effectiveness of the CMP process. If, for example, the removal rate decreases due to, for instance, a degradation of the polishing pad 211, it is to be expected that the process of steadily planarizing the initial surface topology of the copper layer 105 is also slowed down, thereby resulting in a reduced slope of the rising edge A of the curve 300. The same holds true for the falling edge C. If, therefore, the slope of the rising edge A and/or of the falling edge C decreases, while the magnitude of the time interval B increases, this may be used as an indicator for a parameter variation of the CMP process. Accordingly, it may be indicated to an operator that one or more process parameters of the CMP tool 210 need to be changed to increase the removal rate. Additionally, or alternatively, in one embodiment, the control unit 222 may be adapted to provide a control signal to the CMP tool 210 when the slope of the rising and/or falling edge is outside a predefined range.

In one illustrative embodiment of the present invention, corresponding reference values for the slope of the rising edge A and/or the falling edge C may be established by empirically determining the removal rate during the CMP process, for example, by processing one or more test wafers while measuring a layer thickness of a metal layer, such as a copper layer, before and after the CMP process.

In a further embodiment, the length of the time interval B may be weighted on the basis of the magnitude of the slope so that the weighted time interval substantially represents the thickness of the initially deposited copper layer 105. A variation of the weighted length may then be used as an indicator for an inappropriate deposition process window.

In one embodiment, when a sufficient degree of stable operation of the deposition process and the CMP process is guaranteed, process parameters for these processes may be established on the basis of one or more product or test substrates processed with an initial set of corresponding process parameters, which are then correspondingly readjusted in accordance with the results obtained.

In one particular embodiment, the process of manufacturing the damascene structure is started with an initial set of parameters for the deposition and the CMP process, and the endpoint detection signal, provided by the optical system 217, is steadily monitored, wherein the control unit 222 determines in situ the time interval B for each substrate being processed and, optionally, the slope of the falling and/or the rising edge to then automatically adjust, depending on the length of the time interval B and the magnitude of the slope of the rising edge and/or the falling edge, at least one process parameter of the deposition process and/or the CMP process, for example, the deposition time and/or the pressure applied to the polishing head, to maintain the amount of copper filled in wide lines approximately constant. In this way, an automatic in situ process control is established, in which it is ensured that wide lines in a damascene structure are sufficiently filled with metal.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for estimating an amount of metal filled in a line in a damascene structure during the chemical mechanical polishing of the structure, the method comprising:

directing a light beam onto said damascene structure;

detecting a secondary light beam reflected by the damascene structure;

determining a first time point indicative of a rising edge and a second time point indicative of a falling edge of an intensity of said secondary light beam; and estimating, from a time interval defined by the first and second time points, the amount of metal filled in the damascene structure.

2. The method of claim 1, wherein estimating includes assessing the amount as insufficient when a length of said time interval is less than a predefined threshold.

3. The method of claim 1, wherein said time interval substantially represents a time period of substantially constant intensity of said secondary light beam.

4. The method of claim 1, further comprising depositing a metal over a patterned dielectric layer to form said damascene structure by using a deposition tool, at least one deposition process parameter of which is controlled to adjust a thickness of said metal layer.

5. The method of claim 4, further comprising establishing a relationship between said time interval and said at least one deposition process parameter.

6. The method of claim 1, further comprising determining a magnitude of a slope of at least one of said rising edge and said falling edge.

7. The method of claim 6, further comprising establishing a correlation between at least one process parameter of the chemical mechanical polishing and said magnitude of the slope.

8. The method of claim 7, wherein a length of said time interval is weighted on the basis of the magnitude of the slope.

9. A method of controlling the amount of metal in a recessed region of a damascene structure to be formed on plurality of substrates, the method comprising:

depositing said metal over a dielectric layer including said recessed region formed on a first substrate;

removing a portion of said metal by chemical mechanical polishing;

detecting an optical endpoint signal during the chemical mechanical polishing of the first substrate;

determining a time interval between a rising edge and a falling edge of said optical endpoint signal; and controlling at least one process parameter of at least one of the deposition of said metal and the chemical mechanical polishing on the basis of said time interval when processing a second substrate.

10. The method of claim 9, wherein said at least one process parameter is at least one of deposition time, polish time and pressure applied to the substrate during the chemical mechanical polishing.

11. The method of claim 9, wherein a deposition process parameter value is varied so as to increase an initial layer thickness of said metal when a length of said time interval is below a predefined first reference value.

12. The method of claim 9, wherein a deposition process parameter value is varied so as to decrease an initial thickness of said metal when a length of said time interval exceeds a predefined second reference value.

13. The method of claim 9, wherein a polishing process parameter value is varied to increase a removal rate when a length of said time interval exceeds a predefined second reference value.

14. The method of claim 9, further comprising determining a magnitude of a slope of at least one of said rising edge and said falling edge.

15. The method of claim 14, wherein at least one process parameter of the chemical mechanical polishing is controlled on the basis of said magnitude of the slope of said at least one rising edge and said falling edge.

16. The method of claim 15, wherein a value of said at least one process parameter is varied to increase the removal rate when said magnitude of the slope is below a predefined lower threshold.

17. The method of claim 15, wherein a length of said time interval is weighted on the basis of the magnitude of the slope.

18. The method of claim 17, wherein at least one process parameter is controlled on the basis of said weighted length of the time interval.

* * * * *